United States Patent [19]
Hoeberechts

[11] Patent Number: 4,652,899
[45] Date of Patent: Mar. 24, 1987

[54] RADIATION-SENSITIVE SEMICONDUCTOR DEVICE HAVING REDUCED CAPACITANCE

[75] Inventor: Arthur M. E. Hoeberechts, Eindhoven, Netherlands

[73] Assignee: U.S. Philips Corporation, New York, N.Y.

[21] Appl. No.: 627,309

[22] Filed: Jul. 2, 1984

[30] Foreign Application Priority Data

Jul. 14, 1983 [NL] Netherlands .................. 8302516

[51] Int. Cl.⁴ .................. H01L 27/14; H01L 31/00
[52] U.S. Cl. .................. 357/29; 357/16; 357/20; 357/30; 250/370
[58] Field of Search .................. 357/30, 29, 20, 16; 250/370

[56] References Cited

U.S. PATENT DOCUMENTS 3,501,678  3/1970  Schuler .................. 250/370.14
4,394,676  7/1983  Agouridis .................. 357/29

Primary Examiner—James W. Davie
Assistant Examiner—Georgia Y. Epps
Attorney, Agent, or Firm—Robert T. Mayer; Steven R. Biren

[57] ABSTRACT

The capacitance of a radiation-sensitive diode can be considerably reduced by giving it the form of a pn junction (4) between a first semiconductor region (4) and a layer-shaped semiconductor zone, which in operation is fully depleted. The speed of such a diode is favorably influenced by the choice or the shape of the geometry of the layer-shaped zone. When the latter is formed with parts decreasing in width of thickness, an electric field is produced in these parts which accelerates the transport of minority charge carriers to a central contact.

9 Claims, 7 Drawing Figures

RADIATION-SENSITIVE SEMICONDUCTOR DEVICE HAVING REDUCED CAPACITANCE

BACKGROUND OF THE INVENTION

The invention relates to a radiation-sensitive semiconductor device comprising a semiconductor body which has at least one radiation-sensitive diode with at least one pn junction between a first semiconductor region of a first conductivity type and a layer-shaped semiconductor zone of a second conductivity type opposite to the first conductivity type and having such a thickness and impurity concentration that the layer-shaped zone is depleted in the operating condition substantially throughout its thickness and over its complete surface area.

Radiation-sensitive semiconductor devices of the aforementioned kind are used inter alia for directly converting electromagnetic radiation, especially visible light and infrared radiation, into an electrical current or voltage. Such photodiodes are used, for example, in electrooptical communication techniques. Such semiconductor devices are also utilized in medical apparatus, such as an X-ray scanner which is provided with a scintillator of, for example, caesium diode which converts the X-ray radiation into radiation to which the photodiode is particularly sensitive. Additionally, such devices are used for detecting particle radiation, such as, for example, electron radiation.

A problem in such radiation detectors often is the high capacitance of the pn junction. Such a high capacitance adversely affects the high-frequency behavior of such a radiation detector and moreover gives rise to a poor signal-to-noise ratio especially at a weak signal (that is to say a low radiation intensity).

This capacitance is generally determined inter alia by the extent of the surface area of a diffusion region (mostly a p-type diffusion region in an n-type semiconductor body). However, the relevant surface area is preferably chosen to be as large as possible in order to obtain the highest possible radiation sensitivity of the detector and hence the highest possible photocurrent. In order to neutralize in part the high capacitance associated therewith, the surface area of the diffusion region can be slightly reduced in that this region is given, for example, a finger structure.

A semiconductor device of the kind mentioned above is known from Japanese Kokai No. 53-136987.

The capacitance of the radiation-sensitive pn junction shown therein is considerably reduced in that in the operating condition the layer-shaped semiconductor zone of the second conductivity type is fully depleted.

In such a device, problems may arise especially when the connection contacts both of the region of the first conductivity type and of the region of the second conductivity type are located on the side of the incident radiation. The contact metallizations, i.e. also those of the layer-shaped zone, are in fact preferably kept as small as possible in order to obtain the largest possible effective surface area of the radiation detector. The minority charge carriers generated by radiation in the depleted layer-shaped zone must reach the connection contact by diffusion, which adversely affects the speed of the radiation-sensitive semiconductor device. Especially in medical applications it is of importance that this speed is sufficiently high because this speed is a factor determinative of the exposure time for X-ray exposures and hence of the radiation dose to which the patient is subjected.

SUMMARY OF THE INVENTION

The invention has for its object to provide a device in which these disadvantages are substantially obviated.

It is based on the recognition of the fact that this can be achieved inter alia in that the layer-shaped zone is given a specific geometry.

For this purpose, a semiconductor device of the kind mentioned above is characterized in that the layer-shaped semiconductor zone, viewed from above, comprises a plurality of subzones which, viewed from a junction point, decrease in width. The layer-shaped semiconductor zone preferably has a central part from which the subzones extend as projecting parts.

Thus, it is achieved that, when the pn junction between the layer-shaped zone and the first semiconductor region is biased in the reverse direction, such a variation of the potential drop occurs in the projecting parts that an electric field is produced thereby which accelerates the minority charge carriers towards the central part at which they are drained. By this measure, the transport of the minority charge carriers is considerably accelerated and a reliable signal is more rapidly obtained; in applications for X-ray exposures, the exposure time and the radiation dose are consequently reduced.

The effect of an accelerating electric field may also be obtained in a quite different manner, i.e. by causing the thickness of the layer-shaped zone to decrease gradually.

Another semiconductor device according to the invention is therefore characterized in that the layer-shaped semiconductor zone comprises at least one subzone which viewed in the direction from a connection region for the layer-shaped zone, decreases in thickness.

A further advantage consists in that due to the fact that the projecting parts are substantially entirely depleted, the capacitance of the pn junction is considerably reduced. As a result, such a semiconductor device has a favorable signal-to-noise ratio.

The layer-shaped zone, viewed from above, is preferably star-shaped, the projecting parts forming the rays of a six- or eight-rayed star. In applications for computer X-ray tomography, one diode generally comprises a matrix of such subdiodes.

BRIEF DESCRIPTION OF THE DRAWING

The invention will now be described more fully with reference to several embodiments and the drawing, in which:

FIG. 5 shows a part of a semiconductor device according to the invention which comprises several diodes, while

Figure 1:
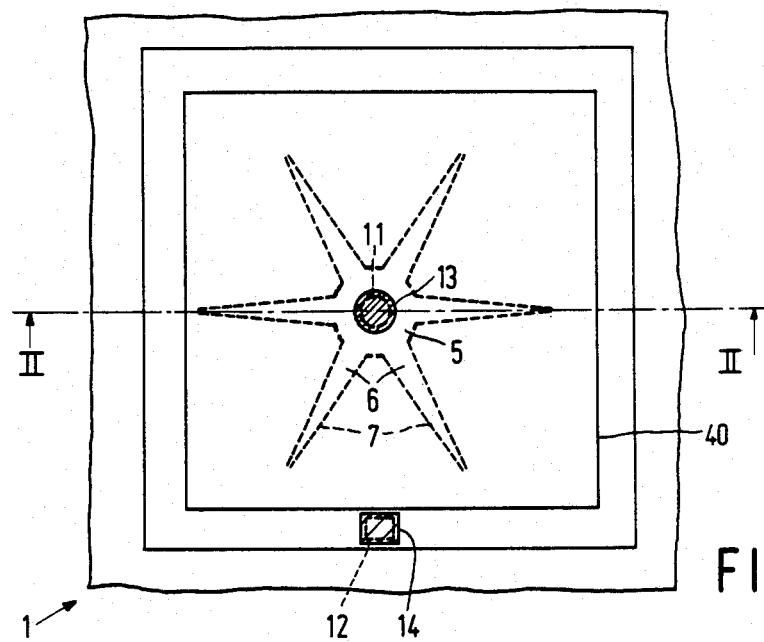
FIG. 1 shows diagrammatically a plan view of a radiation-sensitive diode according to the invention.

The Figures are schematic and not drawn to scale, while for the sake of clarity in the cross-sections especially the dimensions in the direction of thickness are strongly exaggerated. Semiconductor zones of the same conductivity type are generally hatched in the same direction; in the Figures, corresponding parts are generally designated by the same reference numerals.

Description of the Preferred Embodiments

Figure 2:
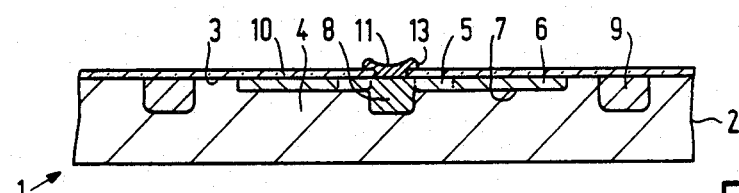
FIG. 2 shows a diagrammatic cross-section taken on the line II—II in FIG. 1.

The device 1 of FIGS. 1, 2 comprises a semiconductor body 2 having in this embodiment an n-type surface region 4 having a sheet resistance of 10Ω·cm corresponding to a donor concentration of approximately $5 \cdot 10^{14}$ atoms/cm$^3$. There is provided at the surface 3 of the semiconductor body a layer-shaped surface zone 5,6 of the p-type, which forms a pn junction 7 with the n-type region 4. The average doping of the semiconductor zone 5,6 is $2 \cdot 10^{14} - 10^{15}$ acceptor atoms/cm$^3$, while the thickness is approximately 1 $\mu$m. This means that the zone 5,6 is entirely depleted at a low voltage across the pn junction 7 in the reverse direction.

According to the invention, the semiconductor zone 5,6 comprises, viewed from above, (see FIG. 1) several projecting parts 6, which, viewed from the center to the periphery, decrease in width, for example, from 5 $\mu$m to 2 $\mu$m over a distance of 50 $\mu$m. Typically, the length of a projecting part or subzone is at least 5 and at most 25 times its maximum width. In the present case, this is achieved in that the said zone is given the form of a six-rayed star. In the central part 5 is formed a p$^+$-zone 8 for contacting the zone 5,6. For contacting the n-type surface region 4, the star-shaped p$^-$ zone is surrounded in the present embodiment of an n$^+$ contact diffusion 9. The surface 3 is coated with an insulating layer 10 in which contact holes 11 and 12 are provided, via which the p$^+$ zone 8 and the n$^+$ contact diffusion 9, respectively, are contacted with the metallization patterns 13,14.

Due to the fact that the p-type zone 5,6 is depleted substantially throughout its thickness and surface area in the operating condition, the associated depletion capacitance is substantially negligible, which results in that the device of FIGS. 1 and 2 has a very favorable signal-to-noise ratio.

Figure 3:
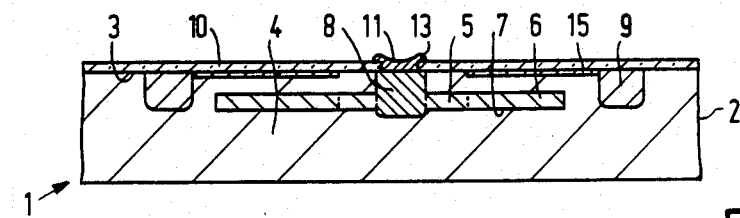
FIG. 3 is a variation of the device shown in FIG. 2.

The semiconductor zone 5,6 may be formed, for example, by means of ion implantation and need not necessarily be located at the surface, as illustrated in the device of FIG. 3, which otherwise is identical to that of FIG. 2, except for the surface layer 15 of the n$^+$ type. Such a highly-doped surface layer generates an electric field, as a result of which minority charge carriers (in this case holes) are accelerated towards the underlying n-type region 4. Consequently, as is known, the possibility of surface recombination is reduced so that the sensitivity of the radiation-sensitive semiconductor device is increased.

Figure 4:
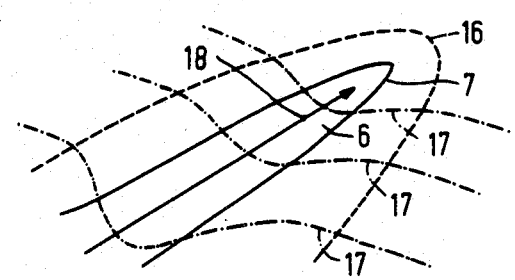
FIG. 4 is a diagrammatic representation of the potential variation and associated electric fields in a part of a diode shown in FIGS. 1, 2.

As stated above, the projecting parts 6 are fully depleted in the operating condition. Although this condition can be reached at 0 V with a suitable doping, it is generally achieved in that the pn junction 7 is biased in the reverse direction. FIG. 4 shows diagrammatically such a part 6 with the associated depletion zone 16. The potential variation due to the reverse voltage across the pn junction 7 is shown at different areas by means of dot-and-dash lines 17. With the width of the parts 6 increasing from the ends towards the center, the associated voltage drop across the pn junction 7 becomes gradually larger, which gives rise to an electric field, which in FIG. 4 is indicated diagrammatically by the arrow 18. This field has an accelerating effect on the electrons reaching the part 6 towards the central part 5.

Electrons generated in the n-type region 4 are now accelerated by the reverse voltage of the pn junction 7 to one of the projecting parts 6 or to the central part 5 as soon as they have reached the depletion zone associated with this pn junction. If these electrons reach one of the projecting parts 6, they are accelerated towards the central part 5 due to the particular form of these parts 6. In this manner, the electrons generated by radiation are drained rapidly and efficiently to the contact metallization 13.

Figure 5:
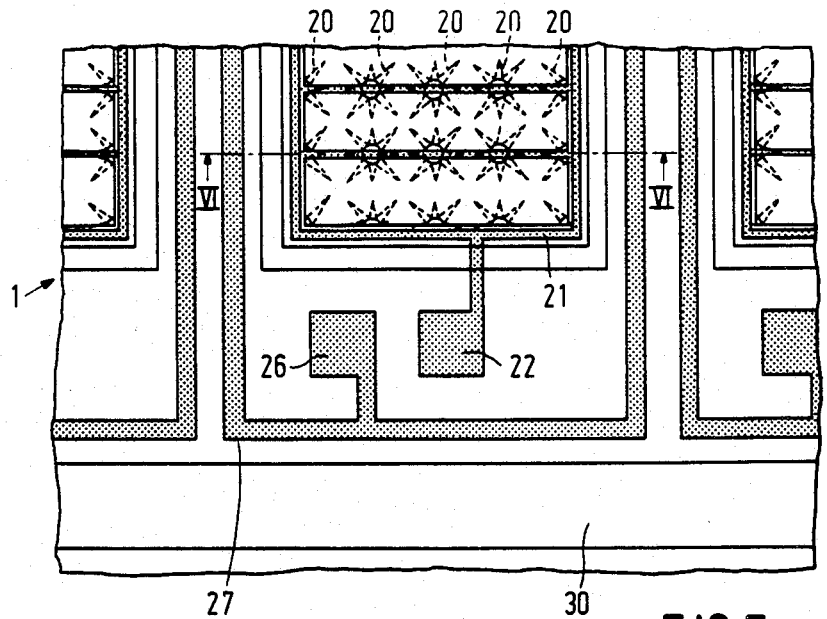
Figure 6:
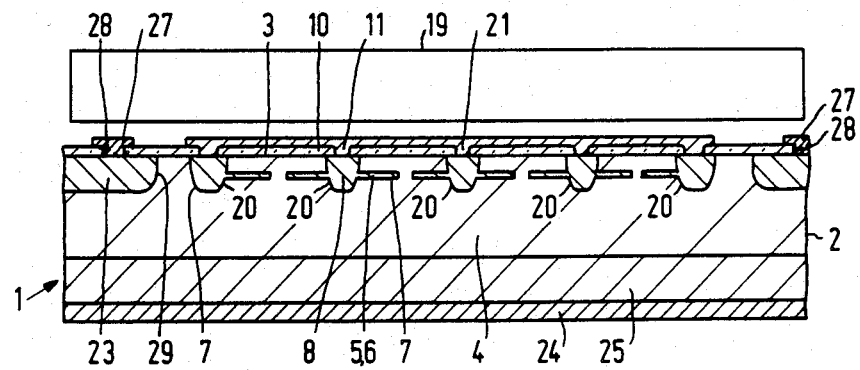
FIG. 6 shows a cross-section taken on the line VI—VI in FIG. 5.

FIGS. 5 and 6 show a part of a semiconductor device according to the invention which is suitable to be used in an X-ray scanner. The X-ray radiation to be recorded is converted in this embodiment by means of a scintillator 19 of, for example, casesium iodide, into radiation to which the device 1 is particularly sensitive. The device 1 comprises several diodes which in turn are composed of a plurality of subdiodes 20, which is general have a star-shaped geometry in the same manner as described above with reference to FIGS. 1 to 3. For draining the overall signal of the subdiodes 20 from one diode, the device comprises a metallization pattern 21 having inter alia a bonding pad 22. Each of the diodes is surrounded by a p-type region 23, which will be described further below. The reverse voltage across the pn junction 7 of the sub-diodes 20 is applied between the p-type regions 5,6,8, which are contacted through the contact hole 11 by means of the metallization pattern 21 and a contact 24 on the lower side of the device. For a satisfactory contacting, a highly doped n-type contact zone 25 is situated between this contact 24 and the n-type layer 4.

By means of the bonding pad 26, which contacts the p-type region 23 via the metallization pattern 27 and the contact hole 28, the pn junction 29 between this p-type region 23 and the n-type region 4 can also be biased in the reverse direction in such a manner that the associated depletion region is tangent to the depletion regions of the adjacent pn junction 7 of the subdiodes 20. Thus, marginal effects are avoided, as described more fully in Dutch Patent Application No. 8003906 corresponding to British Pat. No. 2080026.

In fact, one bonding pad 26 would be sufficient for all the diodes in such a device, which comprises, for example, 24 such diodes because the p$^+$ region contacted by means of the metallization pattern 26,27 surrounds all the diodes. When each of the diodes is provided with an individual connection 26, however, an increased manufacturing yield can be obtained. This will be described more fully with reference to FIG. 7.

Figure 7:
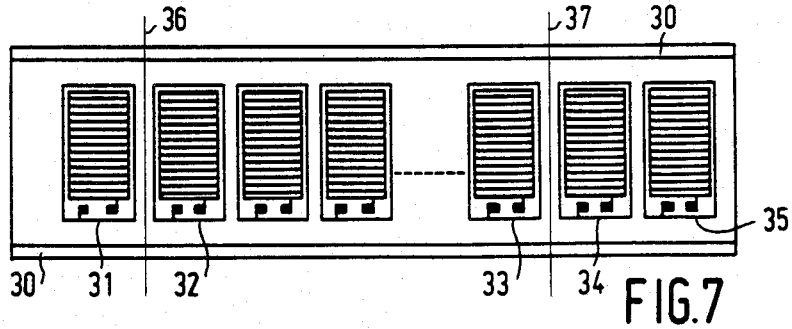
FIG. 7 is a diagrammatic plan view of a part of a slice from which the device shown in FIGS. 5, 6 is manufactured.

FIG. 7 is a plan view of a part of a slice in which are situated between two scribing lanes 30 of the n-type, for example, 72 diodes of the kind described with reference to FIGS. 5 and 6. If for the use in an X-ray apparatus devices are required comprising rows of 24 diodes, for example, it could be sufficient to provide the first, the 25$^{th}$ and the 49$^{th}$ diode with a contact hole 28 and a contact metallization 26,27. Thus, the surrounding regions 23 of the diodes 1 to 24 inclusive, 25 to 48 inclusive and 49 to 72 inclusive could be connected while obtaining the aforementioned advantages with respect to the elimination of marginal effects.

In practice, during manufacture less satisfactorily operating or even defective diodes can be obtained. When now each of the diodes is provided with such a contact metallization 26,27, nevertheless one or more devices out of a row with poorly operating or defective diodes can be obtained provided that in one row 24 satisfactorily operating diodes are present beside each other.

If, for example, in a row the third diode (reference numeral 31 in FIG. 7) is defective, while the $4^{th}$ to $27^{th}$ diodes inclusive are not defective, at least one satisfactorily operating device can be obtained by means of scribing lanes 36 and 37 between the $3^{rd}$ diode 31 and the $4^{th}$ diode 32 and between the $27^{th}$ diode 33 and the $28^{th}$ diode 34, respectively. From the 45 diodes located on the righthand side of the scribing lane 37 again a few diodes may be defective, for example the $29^{th}$ diode (reference numeral 35) or a number of diodes behind the $52^{nd}$ diode. Thus, two satisfactorily operating devices are obtained, while with the use of one contact metallization 26, 27 per 24 diodes no or at most one satisfactorily operating device would have been obtained. The possibility of obtaining a larger number of satisfactorily operating devices per row may be slightly increased by choosing the number of diodes per row slightly larger than 3×24, for example 80, the more so as such poorly operating diodes are generally located at the periphery of the crystal.

The invention is of course not limited to the embodiments shown above, but many variations are possible for those skilled in the art within the scope of the invention. For example, the conductivity types of all the semiconductor regions and zones may be inverted (simultaneously). Additionally different thicknesses and dopings may be chosen for the zones 5, 6, while also the form of the projecting parts 6 may be chosen differently. For example, the subzones 6 in FIGS. 1 to 3 inclusive may also extend from a number of contact zones situated, for example, in the corners of the square 40 in the same manner as in FIG. 5 a few sub-diodes 20 are situated in the corners of the assembly of subdiodes.

Moreover, instead of the width, also the thickness of the semiconductor zones 6 may be decreased gradually, which leads to the same effect, i.e. an accelerating electric field in this zone. Such a semiconductor zone need then not necessarily be subdivided into subzones and may occupy in FIG. 1 substantially the whole surface area of the square 40. Such a zone with decreasing thickness may be obtained, for example, by means of ion implantation through a mask with increasing thickness.

What is claimed is:

1. In a radiation-sensitive semiconductor device comprising a semiconductor body which has at least one radiation-sensitive diode, a first semiconductor region of a first conductivity type and a layer-shaped semiconductor zone of a second conductivity type opposite to the first conductivity type in said first semiconductor region and having a thickness and impurity concentration such that in the operating condition the layer-shaped semiconductor zone is depleted substantially throughout its thickness and over its complete surface area, said radiation-sensitive diode comprising at least one pn junction formed between said first semiconductor region and said layer-shaped semiconductor zone, characterized in that the layer-shaped semiconductor zone, viewed from above, comprises a common connection region and a plurality of subzones which, viewed in the radial direction from the common connection region, decrease in width.

2. In a semiconductor device as claimed in claim 1, characterized in that the length of a subzone is at least 5 and at most 25 times its maximum width.

3. In a radiation-sensitive semiconductor device comprising a semiconductor body having at least one radiation-sensitive diode, a first semiconductor region of a first conductivity type and a layer-shaped semiconductor zone having a second conductivity type opposite to the first conductivity type in said first semiconductor region and having a thickness and impurity concentration such that in the operating condition the layer-shaped semiconductor zone is depleted substantially throughout its thickness and over its surface area, said radiation-sensitive diode comprising at least one pn junction formed between said first semiconductor region and said layer-shaped semiconductor zone, characterized in that the layer-shaped semiconductor zone comprises a connection region and at least one subzone, which, viewed in the radial direction from the connection region, decreases in thickness.

4. A semiconductor device as claimed in claim 1 or 3, characterized in that the layer-shaped semiconductor zone has a central part from which the subzones extend as projecting parts.

5. In a semiconductor device as claimed in claim 4, characterized in that the common connection region is present at the area of the central part of the semiconductor region of the second conductivity type which is doped more heavily than the layer-shaped semiconductor zone.

6. In a semiconductor device as claimed in claim 1 or 3, characterized in that the layer-shaped semiconductor zone, viewed from above, is star-shaped.

7. In a semiconductor device as claimed in claim 1 or 3 characterized in that the radiation-sensitive diode comprises several pn junctions which are provided with common contact metallizations and together constitute the radiation-sensitive diode.

8. In a semiconductor device as claimed in claim 7, characterized in that it comprises several radiation-sensitive diodes and each of the radiation-sensitive diodes is surrounded by a region of the second conductivity type.

9. In a semiconductor device as claimed in claim 8, characterized in that the second conductivity type region surrounding each radiation-sensitive diode is provided with a separate contact connection.

* * * * *